US008736308B2

United States Patent
Bailey et al.

(10) Patent No.: US 8,736,308 B2
(45) Date of Patent: May 27, 2014

(54) PIPELINE POWER GATING

(75) Inventors: Daniel W. Bailey, Austin, TX (US);
Aaron S. Rogers, Pflugerville, TX (US);
James J. Montanaro, Austin, TX (US);
Bradley G. Burgess, Austin, TX (US);
Peter J. Hannan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/176,842

(22) Filed: Jul. 6, 2011

(65) Prior Publication Data

US 2013/0009697 A1    Jan. 10, 2013

(51) Int. Cl.
*H03K 19/00* (2006.01)
*H03K 19/096* (2006.01)

(52) U.S. Cl.
USPC .............................. 326/93; 326/96

(58) Field of Classification Search
USPC ................ 326/37–47, 93–98, 101
See application file for complete search history.

(56) References Cited

U.S. PATENT DOCUMENTS

| 4,980,836 | A | 12/1990 | Carter et al. |
| 7,295,036 | B1 | 11/2007 | Zaveri et al. |
| 7,323,909 | B2 | 1/2008 | Mamidipaka |
| 8,067,962 | B2 * | 11/2011 | Hamada et al. ........... 326/98 |
| 8,266,569 | B2 | 9/2012 | Palisetti et al. |
| 2005/0083081 | A1 | 4/2005 | Jacobson et al. |
| 2006/0226869 | A1 | 10/2006 | Chong |
| 2007/0024318 | A1 | 2/2007 | Mamidipaka |
| 2008/0088344 | A1 | 4/2008 | Mamidipaka |
| 2013/0009693 | A1 | 1/2013 | Bailey |

FOREIGN PATENT DOCUMENTS

EP     1195902 A2    4/2002

OTHER PUBLICATIONS

Seomun, Jun, et al., "Synthesis and Implementation of Active Mode Power Gating Circuits," 47th ACM/IEEE Design Automation Conference '10, Jun. 13-18, 2010, pp. 487-492.
Li Li et al. "Effective algorithm for integrating clock gating and power gating to reduce dynamic and active leakage power simultaneously." Quality Electronic Design. 12th International Symposium IEEE, Mar. 14, 2011. Pages 1-6.
International Search Report and Written Opinion mailed Oct. 24, 2012 in PCT/US2012/045559, 11 pages.

* cited by examiner

*Primary Examiner* — Thienvu Tran
(74) *Attorney, Agent, or Firm* — Abel Law Group, LLP

(57) ABSTRACT

Leakage current is reduced in a plurality of gates coupled between source storage elements and destination storage elements by waking the plurality of gates to allow current flow in response to assertion of any source clock enable signals that enable clocking of the source storage elements. The gates are slept to reduce leakage current in the plurality of gates, in response to assertion of a destination clock enable signal and all of the one or more source clock enable signals being deasserted, the destination clock enable signal enabling clocking of the destination storage elements.

17 Claims, 7 Drawing Sheets

PIPELINE POWER GATING

BACKGROUND

1. Field of the Invention

This invention relates to power savings in integrated circuits and more particularly to reducing leakage current during runtime.

2. Description of the Related Art

Power consumption in integrated circuits can be attributed to both actively switching circuits and to idle circuits. Even when circuits are idle, leakage current from the transistors results in undesirable power consumption. Previous solutions to saving power have identified large architectural features that have been idle for a period of time and have implemented power savings in such circuits by reducing the voltage being supplied and/or the frequency of clock signals being supplied to the unused circuitry. For example, in a multi-core processor, one or more of the cores may be placed in a lower power consumption state by reducing the supplied frequency and/or voltage while maintaining active other functional blocks, such as input/output blocks. However, particularly in battery driven devices, such as mobile devices, laptops, and tablets, finding additional ways to save power is desirable to extend battery life, reduce heat generation, and ease cooling requirements. Even in desktop or server systems, reducing power consumption leads to reduced heat generation, cost savings by reducing electricity use, and reduced cooling requirements. Power saving considerations continue to be an important aspect of integrated circuit and system design.

SUMMARY OF EMBODIMENTS OF THE INVENTION

Additional power savings can be achieved by focusing on small-grained features of the integrated circuit.

One embodiment provides a method of reducing leakage current in a plurality of gates coupled between source storage elements and destination storage elements. The method includes waking the plurality of gates to allow current flow in response to assertion of any of one or more source clock enable signals. The plurality of gates are slept to inhibit current flow to reduce leakage current in the plurality of gates in response to sleep conditions, the sleep conditions including assertion of a destination clock enable signal.

In another embodiment an apparatus includes a plurality of source storage elements and a plurality of destination storage elements. A plurality of power-gated gates are coupled between the source storage elements and the destination storage elements and supply the destination storage elements. One or more power gates are coupled in series between a power supply node and the power-gated gates. The power gates reduce current flow through the power-gated gates in response to a control signal being deasserted, indicating a sleep state and allow current flow through the power-gated gates in response to the control signal being asserted, indicating a wake state. Control logic is coupled to receive one or more source clock enable signals that enable clocking one or more of the source storage elements. The control logic also receives at least one destination clock enable signal. The control logic causes the control signal to indicate the wake state in response to assertion of any of the source clock enable signals, and the control logic is further configured to cause the control signal to indicate the sleep state only after all of the one or more of the source clock enable signals are deasserted and the at least one destination clock enable signal has been asserted, thereby allowing the destination storage elements to be clocked to consume values supplied by the power-gated gates.

In an embodiment the control logic includes a state machine responsive to any of the source enables being asserted to assert a new source enable control signal in a first state of the state machine indicating one or more of the source enables are asserted and to deassert the new source enable in a second state of the state machine in response to all the enables of the source storage elements being deasserted and the at least one destination clock enable signal being enabled, and to deassert the control signal in response to entering the second state of the state machine.

In another embodiment a method is provided that includes reducing current flow in a plurality of power-gated gates coupled between one or more source storage elements and one or more destination storage elements by controlling one or more power gates according to a control signal. One or more source enable signals that enable clocking one or more of the source storage elements are received, and responsive to assertion of any of the one or more source enable signals, causing the control signal to indicate a wake state to the one or more power gates. The control signal indicates the sleep state in response to a first and second condition being true, the first condition being all of the one or more of the source clock enable signals being deasserted and the second condition being that the destination clock enable signal has been asserted thereby allowing the destination storage elements to be clocked to consume values supplied by the power-gated gates.

BRIEF DESCRIPTION OF THE DRAWINGS

The present invention may be better understood, and its numerous objects, features, and advantages made apparent to those skilled in the art by referencing the accompanying drawings.

The use of the same or similar reference symbols in different drawings indicates similar or identical items.

DETAILED DESCRIPTION

Power gating groups of gates achieves additional power savings during run-time operation by reducing the leakage current of transistors in the gates. In one embodiment a power gate is formed by a transistor (or many transistors in parallel)

that are in series between the power-gated gates and their power supplies VDD and/or GND. The power gate(s) are then selectively controlled to disconnect the gates from VDD and/or ground so that the leakage current can be reduced when the gates are not being used.

Figure 1:
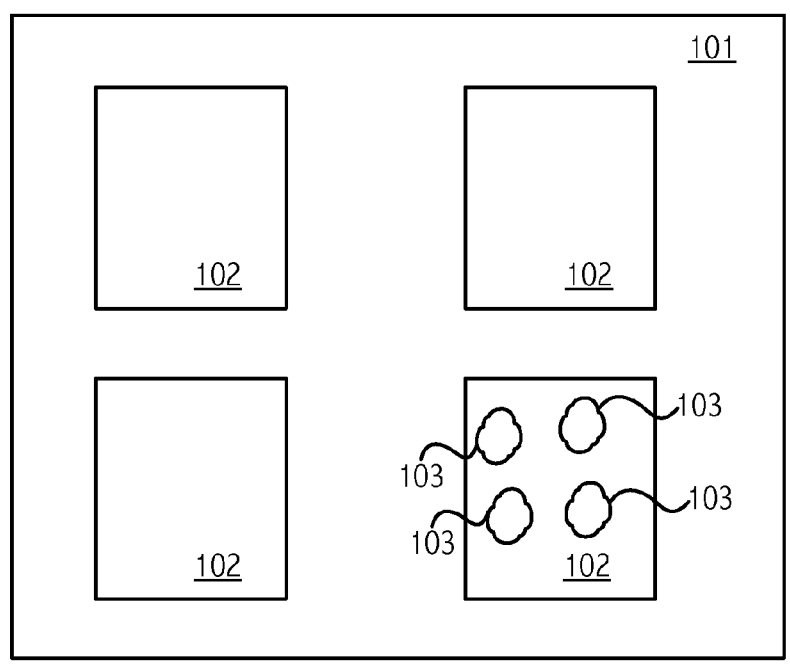
FIG. 1 shows a high level diagram of an integrated circuit suitable for using embodiments of the invention.

Referring to FIG. 1, a high-level block diagram illustrates an integrated circuit 101 such as a microprocessor, which includes multiple macro architectural features 102 such as processing cores, whose power can be controlled by placing them in power states that provide varying levels of performance, from a sleep state to a fully powered state. In addition, one or more of the macro architectural features have groups of gates 103 that can be controlled to reduce power consumption during the full (or a reduced) operational state during run time.

Figure 2:
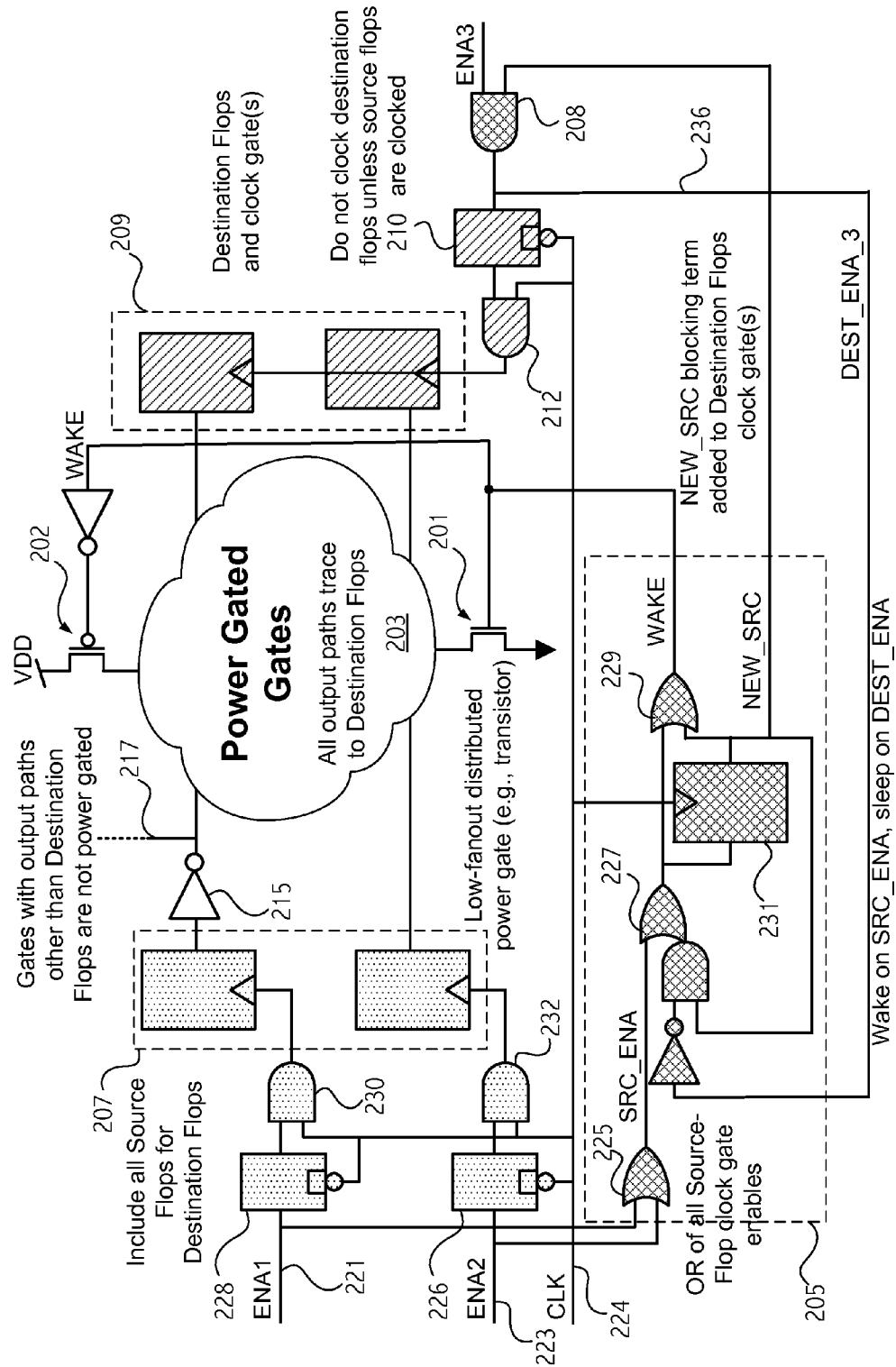
FIG. 2 illustrates a high level diagram of power-gating logic gates according to an embodiment of the invention

FIG. 2 illustrates an exemplary embodiment of how the groups of gates can be controlled during run time to decrease power consumption. Referring to FIG. 2, nFET power gate 201 is in series between the power-gated gates 203 and GND. The power-gated gates 203 correspond to the group of gates 103 shown in FIG. 1. The gates that are power gated are typically AND, OR, NOR, NAND, and similar logic gates and are represented in FIG. 2 as power-gated gates 203. When the gates 203 are idle, the power gate 201 can be turned off, reducing the voltage across the gates and thereby reducing the leakage current from the gates. In addition, or instead of using the nFET 201, a pFET 202 can be used in series with VDD, and switched off to reduce the voltage across the gates, thereby reducing the leakage current.

A significant issue with run-time power gating is having adequate time to transition the gates from sleeping to fully powered, i.e., having enough time to wake. That is, when power gate 201 is turned on, the power-gated gates take time to fully charge to their fully powered state in response to power gate 201 (or 202) turning on. One approach is to include sufficient timing margin in the design, e.g., a guard band in the timing design, to ensure the gates are fully powered. However, such a timing penalty is generally unacceptable in high-performance integrated circuits such as microprocessors.

Control logic 205 monitors the clock gate enables 221 and 223 of the source flip-flops 207 to determine when to wake, and when to sleep the power-gated gates. Note that the AND gate 208 may also be considered part of control logic 205 and helps control the clocking of the destination flip-flops as described further herein. Note that while flip-flops are shown in FIG. 2, any source and destination storage elements, such as latches, may be used instead of, or in addition to, the flip-flops shown in FIG. 2.

FIG. 2 illustrates the basic operation and construction of an exemplary embodiment. A chosen set of destination flip-flops 209 determines the set of gates 203 that can be power gated. That is, a gate can be power gated if all of its output paths terminate exclusively at one of the destination flip-flops 209. Gates with output paths that go to places other than destination flip-flops are not power gated. For example, the inverter 215 has an output path 217 that goes somewhere other than destination flip-flops 209. Accordingly, inverter 215 is not included as part of the power-gated gates 203. The control logic 205 includes a state machine that controls the power gate, monitors the clock gate enables and determines when to wake the power-gated gates, and when the power-gated gates can sleep.

Figure 3:
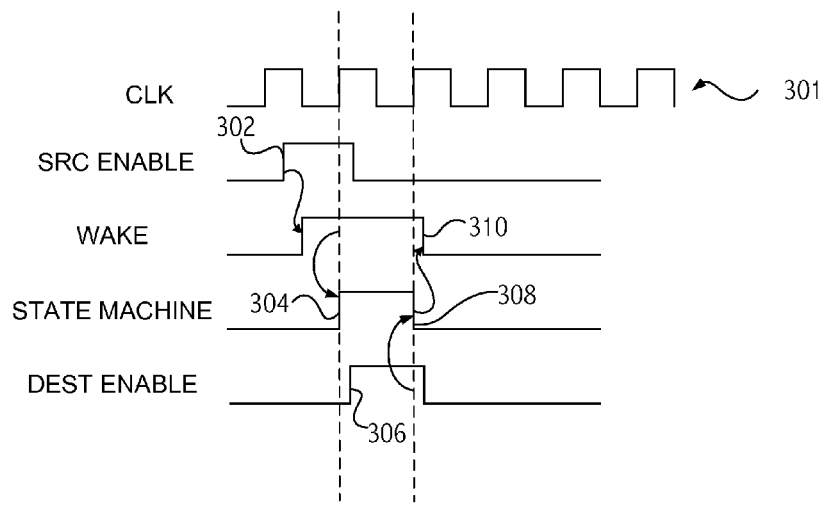
FIG. 3 illustrates a timing diagram associated with the embodiment of FIG. 2.

Consider an initial state of sleep. In the initial sleep state shown in FIG. 2, destination flip-flops 209 are blocked from clocking and the power-gated gates 203 are sleeping. The term sleeping refers to the power gate 201 (or 202) being turned off to reduce leakage current. In the sleeping state the state machine in the control logic 205 is in a first state in which the WAKE signal is deasserted. FIG. 3 illustrates a timing diagram associated with the circuits shown in FIG. 2.

Referring to FIG. 3, assume a clock signal CLK 301 on clock signal line 224. Latches 226 and 228 are used to supply the enable signals ENA1 221 and ENA2 223 for the clock signals for source flip-flops 207. The enable signals are ANDed with the clock signals in AND gates 230 and 232. Gates 203 wake in response to assertion of any of the source flip-flop clock gate enables 221 or 223 (shown at 302) after the delay through OR gates 225, 227, and 229. The state machine flip-flop 231 asserts its output on the rising edge of the next cycle at 304, thus changing to a second state. The assertion of the output of the flip-flop 231 results after a delay in the assertion of the DEST_ENA_3 signal at the output of the AND gate 208 at 306. The destination flip-flops 209 are then clocked after the delay through latch 210 and AND gate 212. The enable (ENA3) for the destination flip-flops is assumed to be asserted at that time. Using the state machine, there is at least a one-cycle delay between assertion of the source enables at 302 and the assertion of the destination enable at 306, allowing the power-gated gates time to fully charge before the destination flip-flop clocks are unblocked and clocked.

The power-gated gates 203 are held awake by the control logic 205 until the destination flip-flops are clocked. Once destination flip-flops are clocked after DEST_ENA_3 236 is asserted at 306 and the source enables 221 and 223 are deasserted, the output of the state machine flip-flop deasserts at 308 at the rising clock edge, returning to the first state, causing the power-gated gates to sleep by deassertion of the WAKE signal at 310. Any further clocks for the destination flip-flops 209 are blocked by AND gate 208 until source flip-flops are clocked again. The destination flip-flops will not change, of course, if the source flip-flops do not change. The blocking function allows a full clock period before destination flip-flop inputs are consumed.

An embodiment may have multiple destination enables. If so, there is a need to wait until all destination clock enable signals have asserted before putting the power-gated gates to sleep. Since conceivably the destination enables can arrive at different times, the signals can be stored in flip-flops and then reset when all bits have been asserted at least once and supplied to the logic to cause sleep through the flip-flop 231. In an embodiment, bits could be encoded to save on the number of flip-flops.

Figure 4A:
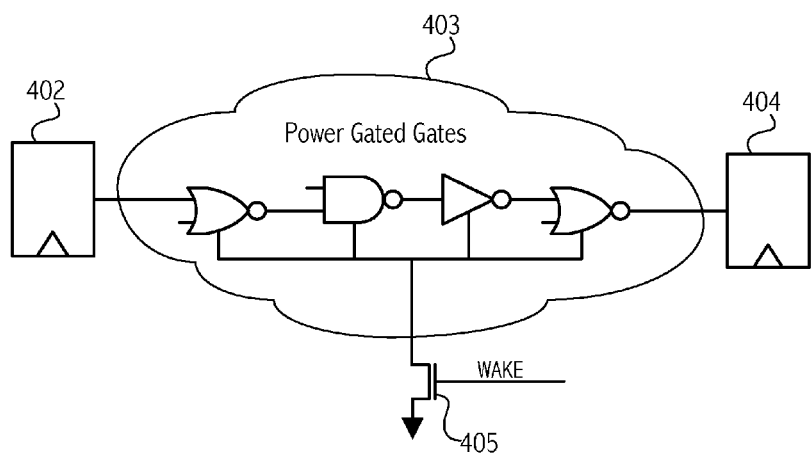
FIG. 4A illustrates an exemplary power-gating approach.
Figure 4B:
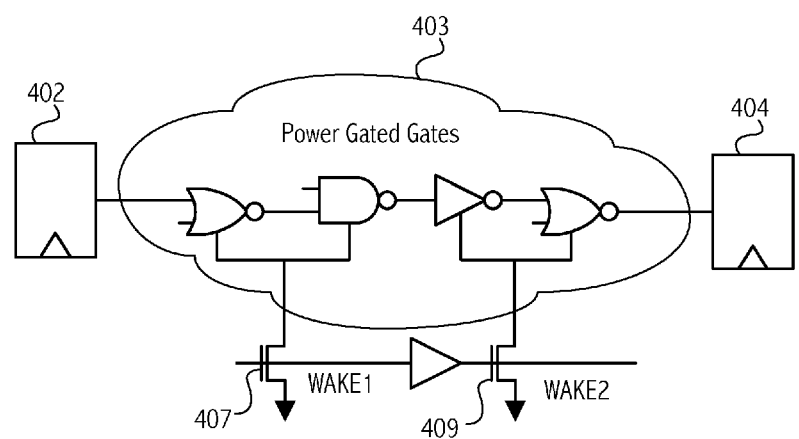
FIG. 4B illustrates an exemplary power-gating approach utilizing additional power gates.

FIG. 4A illustrates an embodiment in which the power-gated gates 403 between source flip-flop 402 and destination flip-flop 404 are coupled to a single power gate 405. In FIG. 4B multiple power gates 407 and 409 are used. If there are a large number of power-gated gates, the distribution of WAKE to the power gates may take several stages of buffers. FIG. 4B shows how timing requirements can be relaxed by partitioning gates into critical timing gates (attached to WAKE1) and non-critical timing gates (attached to WAKE2). Thus, power gate 407 receives WAKE1 and power gate 409 receives WAKE2. Gates temporally closest to the source flip-flops are most critical. In the embodiment shown in FIG. 4B, the power gate for the critical gates receive WAKE1 using no buffers (or fewer buffers) as compared to WAKE2. For ease of illustration, WAKE2 is shown being generated with one buffer and WAKE1 with no buffers. Other number of buffers may be required depending on the particular implementation and the number of power gates driven by each of the wake signals.

Timing requirements are aggressive, but can be relaxed. The OR of the enables of the source flip-flops supplies the state machine flip-flop 231. The clock for the flip-flop 231 can be delayed, however, since it initiates the sleeping function, not the waking.

Figure 4C:
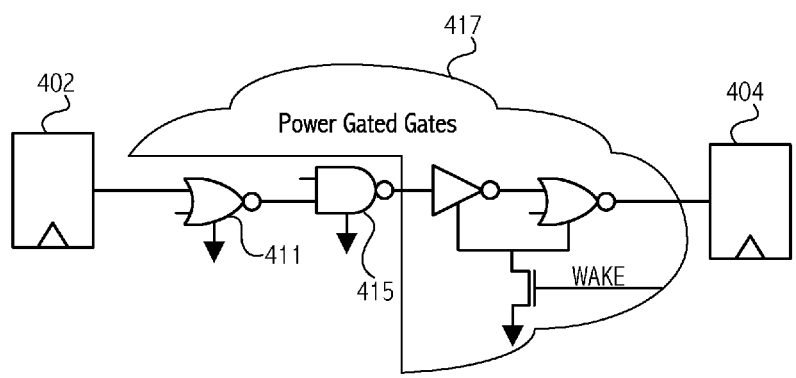
FIG. 4C illustrates a high level diagram of an exemplary power-gating power approach in which timing constraints are eased by eliminating gates from being power gated.

A second timing constraint is that the gates should be fully powered by the time they are used, or timing can suffer. They should be wakened by the time the source flip-flops outputs can transition. This timing constraint can be relaxed by not power gating stages of gates immediately following the source flip-flops. Referring to FIG. 4C, gates 411 and 415 are not power gated and included with power-gated gates 417 to provide additional timing margin for the control signal WAKE to wake the power-gated logic gates. Both of these timing relaxation techniques shown in FIGS. 4B and 4C reduce the leakage savings. As shown in FIG. 4C, the setup requirement can be relaxed by trading off coverage of how many gates are subject to power gating.

The active power gating approach described herein is applicable to microprocessor design, but is widely applicable to circuit design generally. Because the techniques herein can be generally applied to digital circuitry, the active power gating described herein can achieve high coverage, which in turn means more power savings. Timing impact is modest. The timing impact results from a term being ANDed in AND gate 208 in the clock enable path, and there is additional load for the one or more source enable signals from the OR tree. As clock gating efficiency improves over current approaches, the active power gating herein will automatically improve in terms of its impact on leakage savings.

Power gating described herein may lead to higher use of LowVT (LVT) gates, or even UltraLowVT (ULVT) gates, within power-gated domains because leakage power is selectively and transiently reduced. Active-mode power gating puts leakage power on par with dynamic power when making performance-power tradeoffs.

An additional benefit of the approach described in FIG. 2 is that dynamic power is likely to be reduced, too, because of the clock blocking function by AND gate 208 on the clock for the destination flip-flops. That is, if the destination clocks are blocked by the control logic 205, additional power savings occurs.

As has been described above, pipeline Power Gating (PPG) reduces leakage of inactive circuits during run time. In certain embodiments, it is possible to increase the logical coverage of PPG while preserving the original power savings so that leakage savings is increased.

Figure 5:
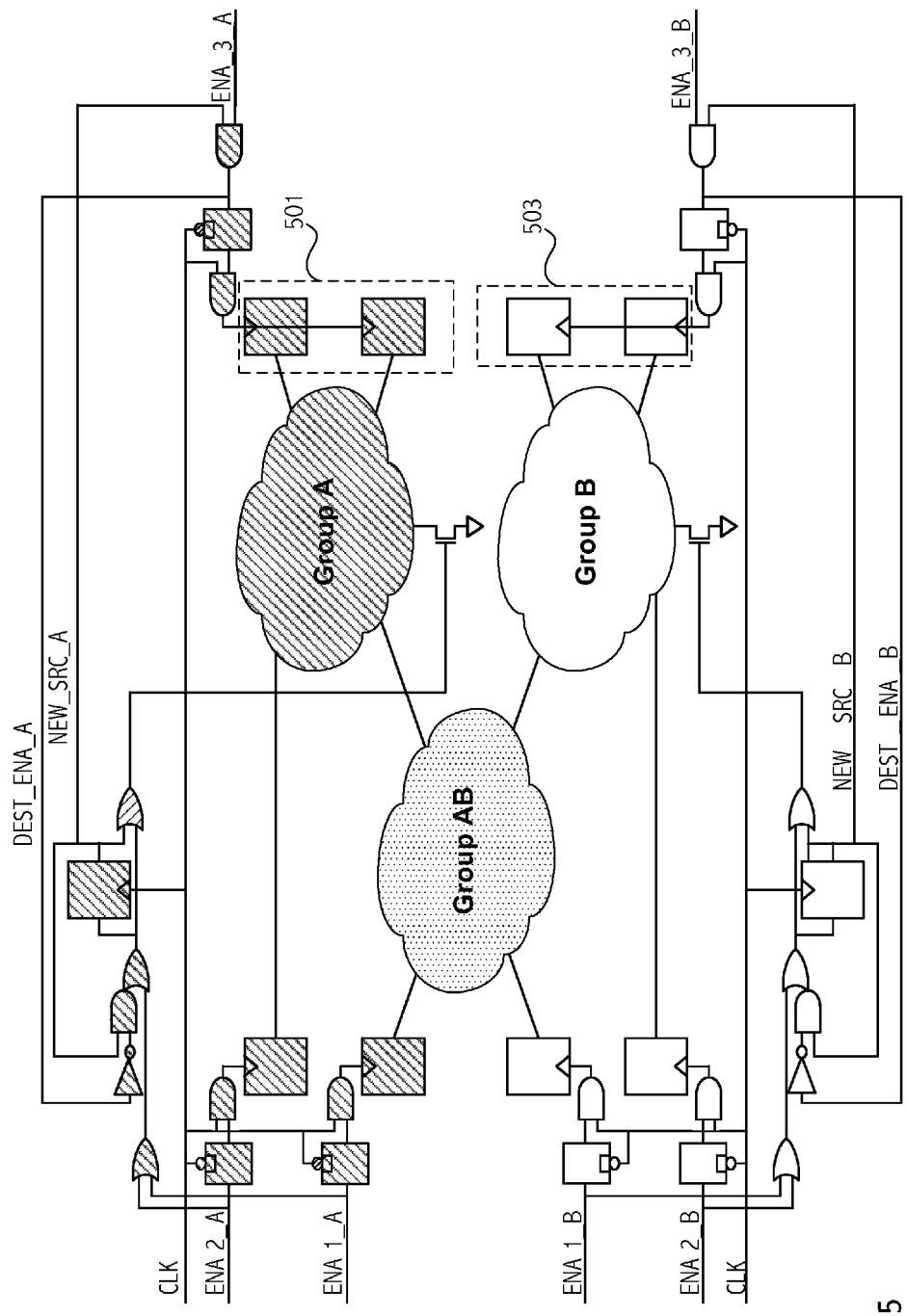
FIG. 5 illustrates a configuration in which gates in Group A and gates in Group B are power gated and gates in Group AB are not power gated.

Referring to FIG. 5, consider the illustrated configuration in which gates in Group A supplying destination flip-flops 501 and gates in Group B supplying destination flip-flops 503 are power gated. Gates in Group AB are not power gated because they terminate in more than one set of destinations, both Group A destination flip-flops and Group B destination flip-flops. Group AB gates must be awake anytime either Group A or Group B destination flops are clocked.

Another important concern is that power-gated domain outputs must not drive fully powered gates without isolation gates. The consequence would be crossover current and possible compromise of reliability. An isolation gate is a gate that is configured to selectively ignore an input, and requires a full-rail signal to control it. For Group A and Group B gates, the isolation gates are the destination flops, and the isolation controls are the clocks. Adding isolation gates to the outputs of Group AB gates would impact timing if generally applied.

Figure 6:
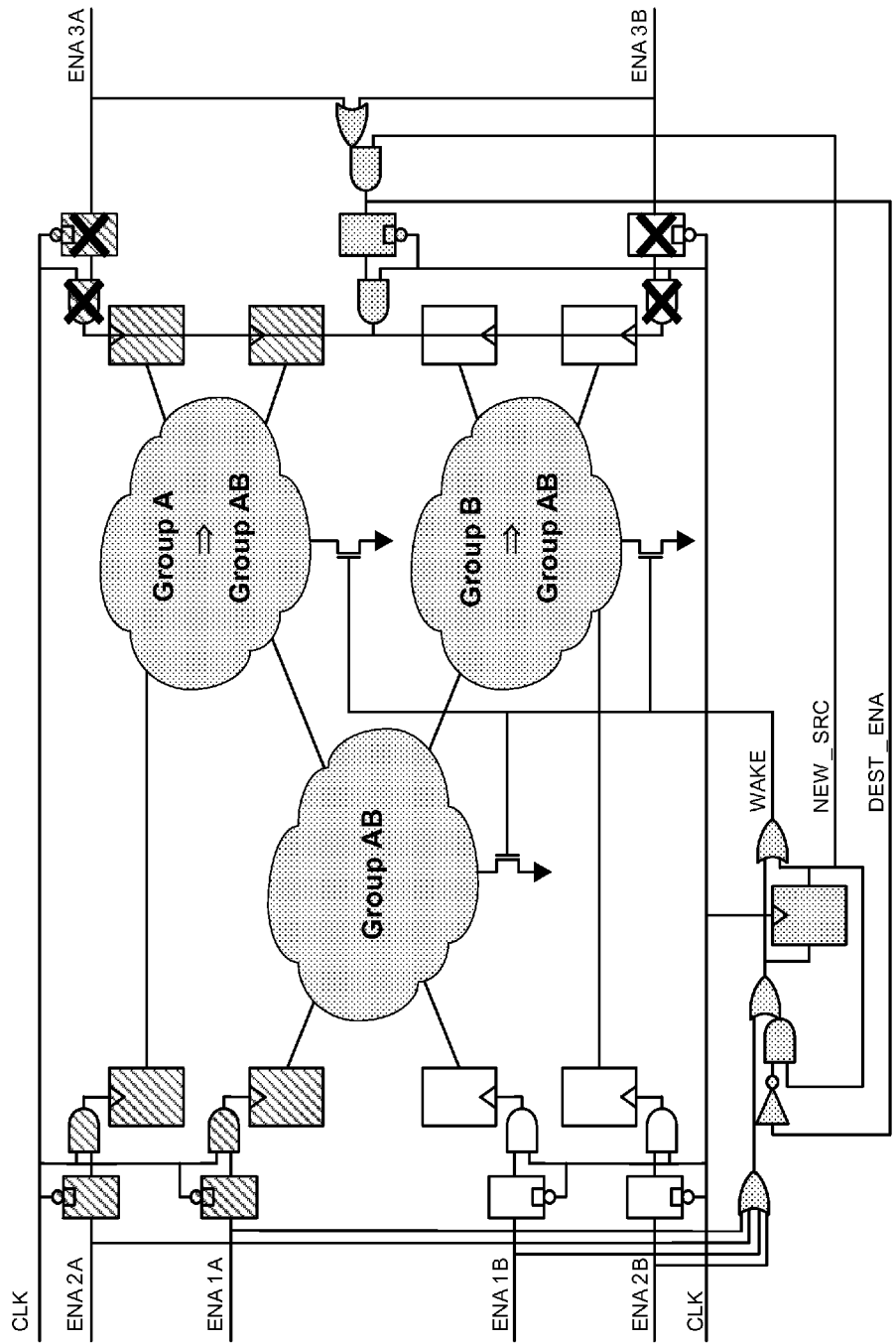
FIG. 6 illustrates a configuration in which logical coverage is increased over the configuration of FIG. 5.

As shown in FIG. 6, logical coverage can be increased by combining the multiple sets of destination flip-flops into a single set of destination flops. As shown in FIG. 6, groups of gates A and B are subsumed into a larger Group AB. The circuit shown in FIG. 6 increases the logical coverage, but the main problem with this approach is that static and dynamic power savings may actually be reduced. Group A gates are now likely to be slept less often than in the original configuration since they are awakened by any of the Group A and Group B source enables. Similarly, dynamic power is likely to increase because Group A destination flops are clocked when either ENA3A or ENA3B is asserted, instead of just ENA3A. The same static and dynamic disadvantages apply to Group B gates.

In addition, there are two other problems with the approach shown in FIG. 6. First, it is unclear which group of gates should be combined when there are more than two sets of destinations. Consider if there are also Group C, AC, BC, and ABC gates. If all groups are subsumed into a Group ABC, then the power savings problem described above is worse. If Group AB is formed, then Groups AC, BC, and ABC are not included in the logical coverage (without duplication of logic). The second problem is that the register transfer language (RTL) description must be rewritten to restructure the logic as groups are combined.

Figure 7:
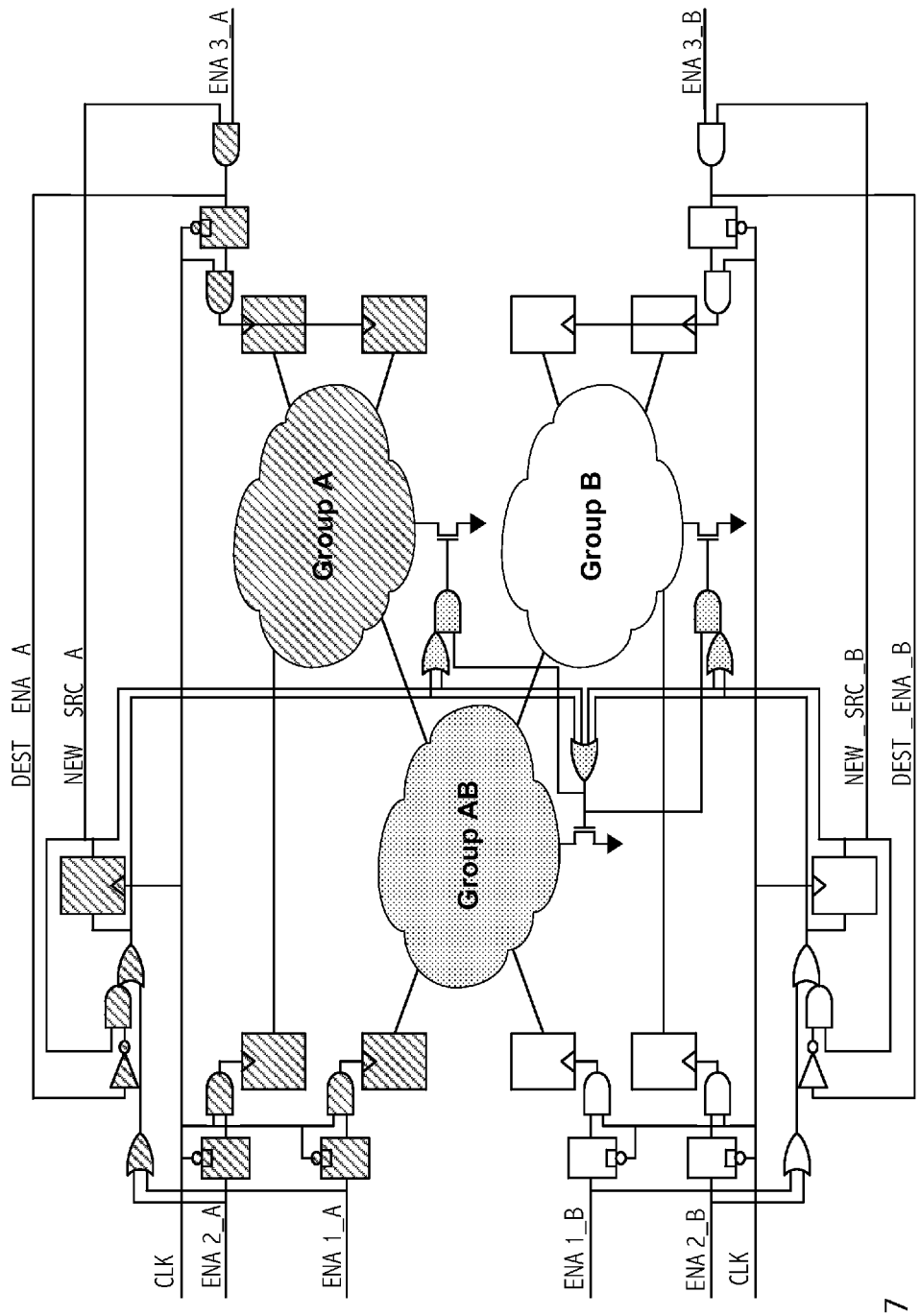
FIG. 7 illustrates another configuration for multiple groups providing improved logical coverage as compared to the configuration of FIG. 5 and improved power savings compared to the configuration of FIG. 6.

FIG. 7 shows an exemplary approach for combining power-gated groups that provides improved logical coverage and power savings. Unlike the circuit in FIG. 6, in FIG. 7 Group A and Group B gates are power gated as often as they are in the original configuration in FIG. 5. Also, Group A and Group B destination flip-flops are clocked as often as they are in the original configuration. Therefore, in FIG. 7, Group AB gates add to the leakage savings. In this approach, anytime either Group A or Group B gates are awake, Group AB gates are also woken. The function of the AND gate driving the Group A power gate is to ensure Group AB gates are awake before Group A gates are woken, i.e., the AND is for power deracing. The same principle applies to the AND gate driving the Group B power gate.

The approach described by FIG. 7 provides another advantage in that the formation of any groups does not prevent the formation of other groups. If there are also Group C, AC, BC, and ABC gates, they can all be power gated separately using similar logic.

Note that the preferred approach reduces timing margin by adding an AND gate delay in the power gate enable path. Also, the register transfer language (RTL) description of the circuit has to be updated as combined groups are added. But the approach of FIG. 7 increases the logical coverage and leakage savings from Pipeline Power Gating without decreasing the dynamic power savings, and the approach is scalable for all combinations of groups.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer-readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. An apparatus comprising:
 a plurality of source storage elements;
 a plurality of destination storage elements;
 a plurality of power-gated gates coupled between the source storage elements and supplying the destination storage elements;
 one or more power gates coupled in series between a power supply node and the power-gated gates, the power gates to reduce current flow through the power-gated gates in response to a control signal being deasserted indicating a sleep state and to allow current flow through the power-gated gates in response to the control signal being asserted to indicate a wake state; and
 control logic coupled to receive one or more source clock enable signals that enable clocking one or more of the source storage elements, and to receive at least one destination clock enable signal, the control logic configured to cause the control signal to indicate the wake state in response to assertion of any of the source clock enable signals, and wherein the control logic is further configured to cause the control signal to indicate the sleep state only after all of the one or more source clock enable signals are deasserted and the destination clock enable signal has been asserted thereby allowing the destination storage elements to be clocked to consume values supplied by the power-gated gates.

2. The apparatus as recited in claim 1 wherein the control logic includes a state machine responsive to any of the source clock enable signals being asserted to assert a new source enable control signal in a first state of the state machine indicating one or more of the source clock enable signals are enabled and to deassert the new source enable in a second state of the state machine in response to all the source clock enable signals for the source storage elements being deasserted and the at least one destination clock enable signal being asserted, and to deassert the control signal for the power gate only after entering the second state of the state machine.

3. The apparatus as recited in claim 2 further comprising a logic gate to combine a first destination clock enable signal with the new source enable signal to generate the destination clock enable signal.

4. The apparatus as recited in claim 1 wherein the control logic ensures that the destination storage elements are not clocked until the power-gated logic is fully charged by blocking the destination clock enable signal for the destination storage elements for at least one clock cycle after one or more of the source clock enable signals are asserted.

5. The apparatus as recited in claim 1 wherein the one or more power gates include one or more NMOS transistors in series between the power-gated gates and ground.

6. The apparatus as recited in claim 1 wherein the one or more power gates include one or more PMOS transistors in series between the power-gated gates and a supply voltage.

7. The apparatus as recited in claim 1 wherein the control logic is configured to supply a blocking signal to block clocking of the destination storage elements until after the source storage elements have been clocked.

8. The apparatus as recited in claim 7 wherein the blocking signal is logically combined with a first destination clock enable signal to enable clocking of the destination storage elements.

9. The apparatus as recited in claim 1 further comprising at least one gate that is coupled between the source storage elements and the destination storage elements, and that is closer to the source storage elements, the at least one gate having an output signal that supplies the destination storage elements exclusively, the at least one gate being excluded from power gating while other gates between the source storage elements and the destination storage elements are power gated.

10. A method comprising:
 reducing current flow in a plurality of power-gated gates coupled between one or more source storage elements and one or more destination storage elements by controlling one or more power gates according to a control signal;
 receiving one or more source enable signals that enable clocking one or more of the source storage elements, and responsive to assertion of any of the one or more source enable signals, causing the control signal to indicate a wake state to the one or more power gates; and
 receiving a destination clock enable signal and causing the control signal to indicate the sleep state in response to a first and second condition being true, the first condition being all of the one or more of the source enable signals are deasserted and the second condition being the destination clock enable signal has been asserted thereby allowing the destination storage elements to be clocked to store inputs supplied by the power-gated gates.

11. The method as recited in claim 10 further comprising:
 entering a first state of a state machine and asserting a new source enable control signal in the first state of a state machine in response to one or more of the source enable signals being asserted; and
 entering a second state and deasserting the new source enable in the second state of the state machine in response to all the source enable signals of the source storage elements being deasserted and the at least one destination clock enable signal being asserted.

12. The method as recited in claim 11 further comprising logically combining a first destination clock enable signal with the new source enable signal to generate the destination clock enable signal.

13. The method as recited in claim 10 further comprising supplying the control signal to one or more NMOS transistors in series between the power-gated gates to ground, the one or more power gates being comprised of the NMOS transistors.

14. The method as recited in claim 10 further comprising supplying the control signal to one or more PMOS transistors in series between the power-gated gates and a supply voltage, the one or more power gates being comprised of the PMOS transistors.

15. The method as recited in claim 10 further comprising supplying a blocking signal to block clocking of the destination storage elements until after the source storage elements have been clocked.

16. The method as recited in claim 15 further comprising combining the blocking signal with a first destination clock enable signal to generate the destination clock enable signal.

17. A tangible computer-readable medium storing a computer readable representation of an integrated circuit, the computer readable representation comprising a representation of:
- a plurality of source storage elements;
- a plurality of destination storage elements;
- a plurality of power-gated gates coupled between the source storage elements and supplying the destination storage elements;
- one or more power gates coupled in series between a power supply node and the power-gated gates, the power gates to reduce current flow through the power-gated gates in response to a control signal being deasserted indicating a sleep state and to allow current flow through the power-gated gates in response to the control signal being asserted indicating a wake state; and
- control logic coupled to receive one or more source clock enable signals that enable clocking one or more of the source storage elements, and to receive one or more destination clock enable signals, the control logic configured to cause the control signal to indicate the wake state in response to assertion of any of the source clock enable signals, and wherein the control logic is further configured to cause the control signal to indicate the sleep state only after all of the one or more source clock enable signals are deasserted and the destination clock enable signal has been asserted thereby allowing the destination storage elements to be clocked to consume values supplied by the power-gated gates.

* * * * *